(12) United States Patent
Louis et al.

(10) Patent No.: US 7,015,760 B2
(45) Date of Patent: Mar. 21, 2006

(54) AMPLIFIER CONTROL BASED ON LOAD IMPEDANCE AND METHODS

(75) Inventors: Lazaar J. Louis, Grayslake, IL (US); Matt C. Hayek, Libertyville, IL (US)

(73) Assignee: Motorola, Inc., Schamubrg, IL (US)

( * ) Notice: Subject to any disclaimer, the term of this patent is extended or adjusted under 35 U.S.C. 154(b) by 40 days.

(21) Appl. No.: 10/691,024

(22) Filed: Oct. 22, 2003

(65) Prior Publication Data

US 2005/0088225 A1   Apr. 28, 2005

(51) Int. Cl.
*H03G 3/10* (2006.01)

(52) U.S. Cl. .......................... 330/285; 330/2

(58) Field of Classification Search ............ 330/2, 330/129, 136, 297, 285, 296
See application file for complete search history.

(56) References Cited

U.S. PATENT DOCUMENTS

| | | | |
|---|---|---|---|
| 6,008,698 A * | 12/1999 | Dacus et al. ............. | 330/279 |
| 6,362,690 B1 | 3/2002 | Tichauer | |
| 6,756,852 B1 * | 6/2004 | Chen ....................... | 330/296 |
| 6,757,526 B1 * | 6/2004 | Sharp et al. ............. | 455/127.1 |

OTHER PUBLICATIONS

RF Micro-Devices, "Quad-Band GSM850/GSM900/DCS/PCS Power Amp Module", RF3140 Rev A4 0306030, 16 pages.

* cited by examiner

*Primary Examiner*—Henry Choe
(74) *Attorney, Agent, or Firm*—Roland K. Bowler, II

(57) ABSTRACT

A method of operating an amplifier, for example, in a wireless radio transceiver, including monitoring a characteristic of the amplifier during an operating interval of the amplifier, for example, during a transmission burst, providing an open-loop control signal to the amplifier during a subsequent operating interval of the amplifier wherein the open-loop control signal based on the characteristic monitored during a previous operating interval. In one embodiment, the corrected control signals are stored in a look-up table (510) that is updated based on the changes in load impedance.

26 Claims, 3 Drawing Sheets

AMPLIFIER CONTROL BASED ON LOAD IMPEDANCE AND METHODS

FIELD OF THE DISCLOSURE

The present disclosure relates generally to amplifiers, and more particularly to compensating for changes in load impedance at amplifier outputs, for example, in power amplifiers suitable for use in transmitter applications in battery-powered wireless communications devices, and methods.

BACKGROUND OF THE DISCLOSURE

In open-loop amplifier architectures, there is no external feedback to the amplifier control signal during operation of the amplifier. Open-loop amplifier output control is desirable in some applications because it has reduced cost and reduced complexity compared to closed-loop amplifier control architectures. For example, open-loop amplifiers permit the elimination of the coupler and detector used commonly at the amplifier output in closed-loop feedback systems. The coupler and detector add cost and consume power.

One contributor to battery power consumption in battery-operated wireless cellular telephones is the current ($I_d$) drawn by the power amplifier during transmission. The current ($I_d$) drain is generally a function of the output impedance presented to the power amplifier. Any detuning of the antenna however causes both the magnitude and phase of the load impedance presented to the power amplifier to change, which may be characterized in terms of impedance mismatch relative to a reference impedance. In cellular telephones, for example, antenna detuning occurs as the users handles the telephone, contacts the antenna, etc. The load impedance is also a function of the frequency of the signals transmitted. Thus for a particular output power ($P_{out}$) the current ($I_d$) drain varies depending on the phase of the impedance mismatch.

In open-loop power control transmitter architectures using collector voltage control, the base bias of the amplifier is fixed while the collector voltage is set as a function of the output power. When the output impedance changes, the output power and the current drain may vary exceedingly resulting possibly in out-of-specification performance and excess power consumption.

The various aspects, features and advantages of the disclosure will become more fully apparent to those having ordinary skill in the art upon careful consideration of the following Detailed Description thereof with the accompanying drawings described below.

DETAILED DESCRIPTION

Figure 1:
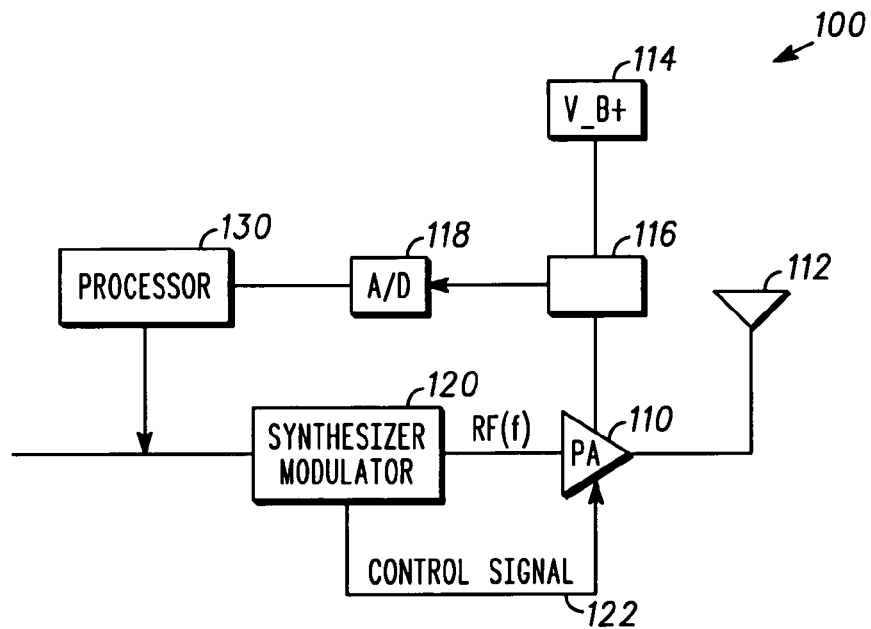
FIG. 1 is an amplifier in an exemplary transmitter application.

FIG. 1 illustrates an exemplary wireless transmitter 100, which is for example part of a transceiver in a wireless communications device. The exemplary transmitter 100 includes a power amplifier 110 having a signal input coupled to a signal output of a synthesizer/modulator 120. The amplifier 110 and synthesizer/modulator 120 may be integrated or discrete elements. The amplifier 110 also includes a control input coupled to a control output of the synthesizer/modulator 120 by a control line 122. The exemplary synthesizer/modulator 120 is also coupled to a controller or processor 130. In the exemplary wireless transmitter, the processor provides signals to be modulated on a carrier signal, having a characteristic frequency, which is amplified by the amplifier 100. In other applications, the amplifier and the method for the operation thereof, examples of which are discussed below, are used in applications other than the exemplary wireless transmitter applications.

In one exemplary transmitter application, the amplifier 110 is activated by control signals from the synthesizer/modulator 120 to operate in a burst mode during which information modulated on a carrier signal is transmitted by or from the transmitter 100. In the exemplary wireless transmitter embodiment, the signal is modulated and amplified pursuant to a wireless communications protocol, for example, the Global System Mobile communications (GSM) standard, although in other embodiments the amplifier may operate pursuant to some other open or proprietary communications standard.

Generally, the amplifier operates on or amplifies signals having a particular frequency or range of frequencies. In some wireless communications applications, for example, the transmitter operates in a frequency-hopping mode, wherein the each burst has a characteristic frequency or range of frequencies on which information is modulated and transmitted.

Each burst, or active interval of the amplifier, is driven by a corresponding control signal that dictates characteristics of the output burst of the amplifier, for example, amplitude, shape, duration, etc. of the burst. In one embodiment, the synthesizer/modulator 120 provides open-loop control signals to the amplifier 110. Open-loop control signals are not modified by feedback when the amplifier is active, for example, during the burst. Any modification to the open-loop control signal is made between bursts, or between active intervals of the amplifier. In other embodiments, however, the control signal is of the closed-loop type, which is modified dynamically by feedback during the active operation of the amplifier.

In the exemplary transmitter embodiment of FIG. 1, an output of the amplifier 110 is coupled to an antenna 112. Generally, the load impedance, including that of the antenna 112 or other load, presented to the amplifier output is frequency dependent. Thus the load impedance at the amplifier output changes generally in dependence on the frequency of the signal RF(f) amplified by the amplifier. In the exemplary transmitter embodiment, the load impedance, including the magnitude and/or phase thereof, at the amplifier output also changes as the antenna is detuned, for example, with changing proximity of the antenna relative to other objects. In wireless communications devices, detuning is caused by interaction between the user and the antenna, e.g., touching the antenna and changing the proximity of the antenna relative to the user and other objects, which may or may not be grounded.

In one embodiment, changes in load impedance at the amplifier output are monitored, for example, by monitoring a characteristic of the amplifier that changes in proportion to changes in the load impedance. Exemplary characteristics of the amplifier that may be monitored include, for example, the output power of the amplifier, a supply current of the amplifier, and/or a supply voltage of the amplifier, among others.

FIG. 1 illustrates a supply voltage source 114 coupled to the amplifier 100. In one embodiment, changes in the load impedance are monitored by monitoring changes in the supply voltage, for example, by detecting changes in the supply voltage when the amplifier is ON and OFF. In the exemplary embodiment of FIG. 1, the processor 130 detects voltage dropped across a resistor 116 interconnecting the voltage supply and the amplifier. In FIG. 1, the processor is coupled to the detector by a signal conditioning circuit 118, including an analog-to-digital (A/D) converter and possibly some filtering and signal scaling circuits. In other embodiments, changes in the load impedance are monitored by detecting changes in the current supplied to the amplifier by the supply voltage source. In another embodiment, a power detector is coupled to the amplifier output for monitoring the output power thereof. The coupler and detector are not illustrated in the drawings but are known generally.

Figure 2:
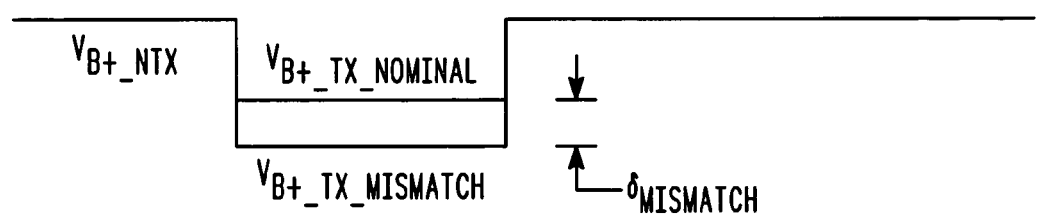
FIG. 2 illustrates a measure of a change in supply voltage to an amplifier.

In the exemplary embodiment, the amplifier output impedance is monitored by detecting changes in the amplifier supply voltage. In FIG. 2, the supply voltage ($V_{B+\_NTX}$) drops when the amplifier is activated. The supply voltage drop results mainly from current drawn by the amplifier during the active interval or burst. The nominal change in supply voltage for specified load impedance, for example, 50 ohms, is given by the following expression:

$$\Delta V_{B+\_Normal} = V_{B+\_NTX} - V_{B+\_TX\_Nominal} \qquad \text{Eqn. (1)}$$

When the load impedance is other than the specified impedance, for example, other than the exemplary 50 ohms target load, the change in supply voltage is given by the following expression:

$$\Delta V_{B+\_Mismatch} = V_{B+\_NTX} - V_{B+\_TX\_Mismatch} \qquad \text{Eqn. (2)}$$

The change in the load impedance relative to the specified load impedance may be expressed as:

$$\delta_{Mismatch} = \Delta V_{B+\_Mismatch} - \Delta V_{B+\_Nominal} \qquad \text{Eqn. (3)}$$

Generally, there may also be a negative supply voltage ($V_{B-\_NTX}$) for which a mismatch could be determined. In one embodiment, the supply voltage is measured during a burst and also before or after the burst.

The change in the load impedance, $\delta_{Mismatch}$, illustrated in FIG. 2, is indicative of mismatched load impedance relative to specified impedance, e.g., 50 ohms in the example above. By minimizing the mismatch, $\delta_{Mismatch}$, the amplifier current drain and performance may be made closer to that which would occur under ideal conditions. Minimizing the mismatch may also reduce variations in current drain and output power.

In one embodiment, a mismatch threshold, $\delta_{Threshold}$, is defined. The mismatch threshold, $\delta_{Threshold}$, is determined by design for a particular application of the amplifier, for example, based on transmitter performance specifications and other factors. In the exemplary transmitter embodiment, for example, this factor could be calculated when the radio current is maximum for a 10 dB mismatch load pull. In some embodiments, positive and negative thresholds, $\delta-_{Threshold}$ and $\delta+_{Threshold}$, are determined. The amplifier control signal may be corrected based on consideration of the mismatch, $\delta_{Mismatch}$, relative to the mismatch threshold, $\delta_{Threshold}$, examples of which are discussed further below.

In another embodiment, a mismatch ceiling, $\delta_{Ceiling}$, is defined. The mismatch ceiling, $\delta_{Ceiling}$, is also determined by design for the particular application of the amplifier, for example, based on transmitter performance specifications and other factors. In the exemplary transmitter embodiment, for example, this factor could be calculated when the supply current is a maximum for some range of mismatch, e.g. a 1–1.6 dB mismatch load pull. In some embodiments, positive and negative ceilings, $\delta-_{Ceiling}$ and $\delta+_{Ceiling}$, are determined. The amplifier control signal may be corrected based on consideration of the mismatch, $\delta_{Mismatch}$, relative to the mismatch ceiling, $\delta_{Ceiling}$, examples of which are discussed further below. In one embodiment, the mismatch ceiling, $\delta_{Ceiling}$, is used in combination with the mismatch threshold, $\delta_{Threshold}$, as a reference by which the mismatch is compared for correcting the amplifier control signal.

Figure 3:
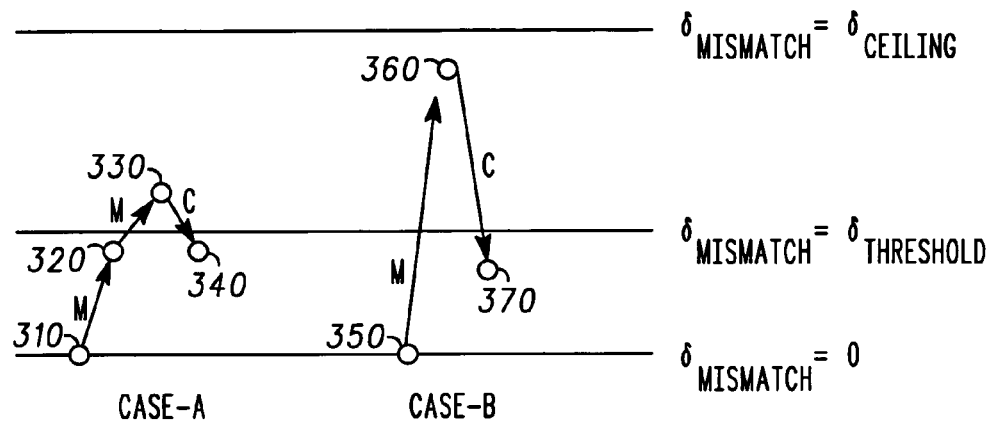
FIG. 3 illustrates use of a reference frame to correct changes in amplifier load mismatch.

In FIG. 3, Case-A, the mismatch, $\delta_{Mismatch}$, increases from the baseline 0-value indicated at 310 to some value less than the mismatch threshold, $\delta_{Threshold}$, indicated at 320. The mismatch values indicated at 310 and 320 may be based on one or more measurements during corresponding burst or active intervals of the amplifier. For example, the mismatch indicated at 310 corresponds to a first burst in response to the application of a corresponding first control signal to the amplifier, and the mismatch indicated at 320 corresponds to a subsequent burst in response to a corresponding second control signal applied to the amplifier.

In one embodiment, no correction is applied to the control signal unless the mismatch exceeds the mismatch threshold. In FIG. 3, for example, the mismatch indicated at 330 exceeds the mismatch threshold, $\delta_{Threshold}$, which prompts correction of the control signal that will be next applied to the amplifier. The corrected control signal results in a mismatch indicated at 340, below the mismatch threshold, $\delta_{Threshold}$. In one embodiment, a prior control signal is corrected in proportion to the extent to which the mismatch exceeds the threshold. An exemplary scheme for correcting an amplifier control signal is discussed further below.

Figure 4:
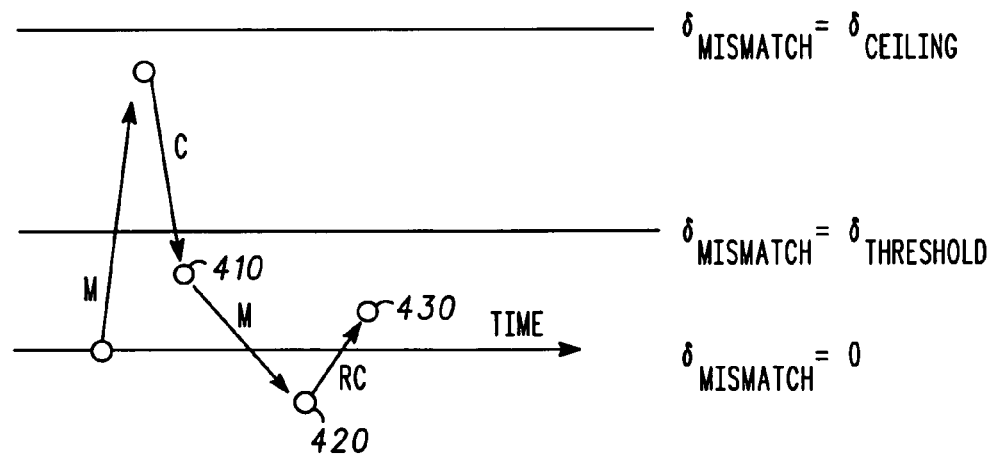
FIG. 4 is another illustration of the use of a reference frame to correct changes in amplifier load mismatch.

In FIG. 3, Case-B, the mismatch increases from a 0-value indicated at 350 to a value that substantially exceeds the mismatch threshold indicated at 360. The control signal is corrected accordingly to reduce subsequent mismatch indicated at 370 below the mismatch threshold, $\delta_{Threshold}$. As suggested above, generally, there may also be a negative mismatch threshold and a negative mismatch ceiling. In FIG. 4, when the mismatch moves in a negative direction from the mismatch indicated at 410 to that indicated at 420, the control signal is corrected to move the mismatch back toward the 0-value indicated at 430. In one embodiment, the control signal is corrected by returning to a default value when the mismatch moves below zero, in the negative direction. In other embodiments and applications, other schemes may be used to correct the control signal, for example, it may be desirable to make minor corrections to the control signal when the mismatch is below the mismatch threshold, $\delta_{Threshold}$.

In one exemplary transmitter embodiment, the amplifier power output is controlled by DAC settings for different power levels or steps, y. The DAC setting is corrected as follows:

$$P_{DAC\_y} = P_{DAC\_INIT,\ y} - \%_{Deviation}/\beta * \%_{Correction} \qquad \text{Eqn. (4)}$$

In Equation (4), $\chi_{Deviation}$ is the deviation above the mismatch threshold, $\delta_{Threshold}$, where $\chi_{Deviation}=\delta_{Mismatch}-\delta_{Threshold}$. In Equation (4), $\chi_{Correction}$ is a correction factor, which is determined at design and may be used to maintain the amplifier power output from dropping below a specified level after correction of the control signal.

The correction factor, $\chi_{correction}$, may be constant or dependent on some other factor, for example, a deviation factor, $\chi_{Dev\_Factor}$. For the case where there is no difference in the phase angle between maximum current drain and maximum power output, the correction factor, $\chi_{Correction}$, may be a constant, for example with an exemplary value of 1.2. For the case where there is a difference in the phase angle between maximum current drain and maximum power output, for example, due to a different implementation of voltage control, the correction factor, $\chi_{Correction}$, depends on the deviation factor, $\chi_{Dev\_Factor}$, and/or on the amount of the phase angle difference. In one embodiment, the deviation factor is defined as $\chi_{Dev\_Factor}=\delta_{Mismatch}-\delta_{Threshold})/(\delta_{Ceiling}-\delta_{Threshold})$, where an $\chi_{Dev\_Factor}$ of 1 corresponds to the worst case mismatch condition. In one embodiment, the control signal, and thus the power output, is not corrected for a negative $\chi_{Dev\_Factor}$.

In Equation (4), β is a factor denoting the amount of supply voltage dip per DAC step (mV/DAC). This is generally linearly proportional to the current change per DAC step (mA/DAC), with a constant proportionality factor. In Equation (4) $P_{DAC\_INIT,y}$ is an initial DAC setting for power step y. In one embodiment, any time the $\delta_{Mismatch}$ is less then or equal to zero, the correction control algorithm is disabled and the DAC settings are reverted back to an initial, or default, DAC setting.

Figure 5:
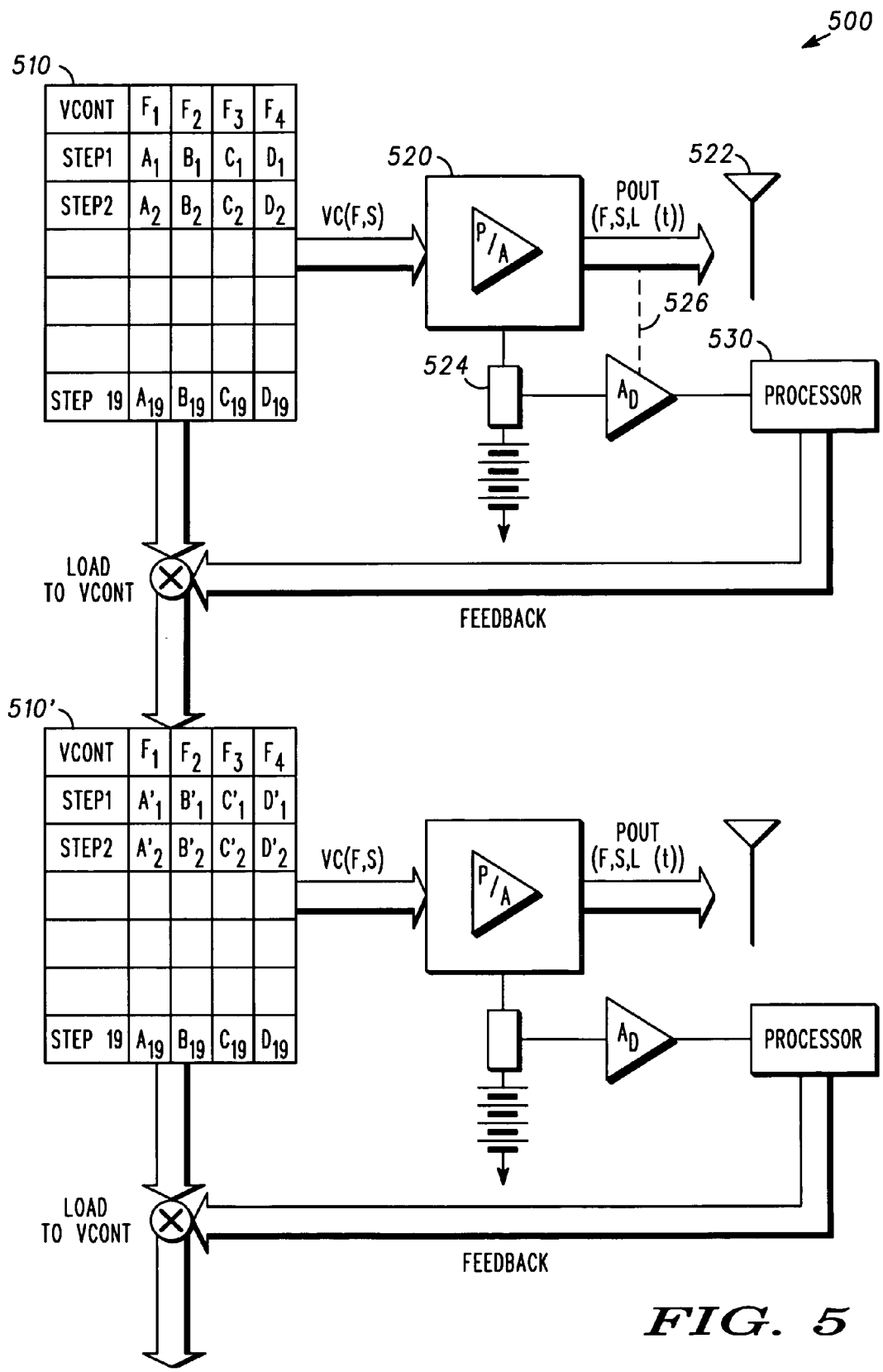
FIG. 5 is a schematic block diagram illustrating updating a control-signal look-up table in an open-loop amplifier control architecture.

In the schematic block flow diagram 500 FIG. 5, an open-loop control signal look-up table 510 is updated based on changes in the load impedance at the output of the amplifier 520. In the exemplary embodiment, the look-up table 510 includes a matrix of control signals, $A_N$, for different power levels, or steps, e.g., STEP$_1$, STEP$_2$, STEP$_3$, etc., at different signal frequencies $F_1$, F2, F3, etc. Alternatively, each control signal, $A_N$, may correspond to a range of power levels and/or a range of frequencies. These and similar schemes are employed in the control of transmitters operating in frequency hopping burst modes pursuant to time division multiplexed (TDM) wireless communications protocols. Generally, the transmitter may also have a table of static default control signals for use under ideal or near ideal conditions, e.g., when the load is matched or nearly matched. The look-up table 510 is a dynamic changing look-up table that is updated based on corrections made to corresponding control signals in the default look-up table, which serves as a reference for correcting the control signals and for use under ideal or near ideal operating conditions.

In FIG. 5, a processor 530 monitors changes in the output impedance, including changes resulting from detuning of the antenna 522. In the exemplary embodiment discussed above, these changes are monitored by monitoring changes in the amplifier supply voltage, for example by detecting the voltage dropped across a resistor or other element 524. Alternatively, the changes in the impedance may be monitored by detecting the output power, as indicated by the dashed line 526 in FIG. 5. In one embodiment, the dynamic look-up table values are obtained by averaging the amplifier characteristic monitored, for a particular frequency and power step, over multiple operating intervals of the amplifier.

Feedback from the processor is used to correct or update the open-loop control signals in the dynamic look-up table. Exemplary bases for updating the control signals is discussed above. Look-up table 510' includes updated or corrected open-loop control signals, $A'_N$, at some time later relative to the look-up table 510. The updated open-loop control signals, $A'_N$, in the look-up table 510' are based on corrections made to the control signals in look-up table 510. Thus in open-loop control architectures, the open-loop control signal applied to the amplifier during an instant burst is either a default control signal or a corrected control signal based generally an amplifier characteristic monitored during a previous burst.

While the present disclosure and what the best modes of the inventions have been described in a manner establishing possession thereof by the inventors and enabling those of ordinary skill in the art to make and use the same, it will be understood and appreciated that there are many equivalents to the exemplary embodiments disclosed herein and that modifications and variations may be made thereto without departing from the scope and spirit of the inventions, which are to be limited not by the exemplary embodiments but by the appended claims.

The invention claimed is:

1. A method of operating an amplifier, the method comprising:
    monitoring a characteristic of the amplifier during an operating interval of the amplifier;
    providing an open-loop control signal to the amplifier during a subsequent operating interval of the amplifier,
    the open-loop control signal based on the characteristic monitored during a previous operating interval.

2. The method of claim 1,
    comparing the characteristic monitored with a reference characteristic;
    selecting the open-loop control signal provided to the amplifier during the subsequent operating interval based on the comparison of the characteristic monitored with the reference characteristic.

3. The method of claim 1,
    monitoring the characteristic of the amplifier includes monitoring the characteristic over multiple operating intervals of the amplifier, and averaging the characteristic monitored,
    generating the open-loop control signal based on the average of the characteristic monitored over the multiple operating intervals of the amplifier.

4. The method of claim 1, monitoring the characteristic of the amplifier includes detecting at least one of an output power of the amplifier, a supply current of the amplifier, and a supply voltage of the amplifier.

5. The method of claim 1, monitoring the characteristic of the amplifier includes detecting a change in at least one of a supply voltage or supply current when the amplifier is turned ON.

6. The method of claim 1,
    the open-loop control signal based on the characteristic monitored during the previous operating interval is obtained by correcting a prior open-loop control signal based on the characteristic monitored relative to a reference frame.

7. The method of claim 6,
    comparing the characteristic monitored with a reference,
    correcting the prior open-loop control signal if the comparison of the characteristic monitored with the reference exceeds a first threshold,
    not correcting the prior open-Loop control signal if the comparison of the characteristic monitored with the reference does not exceed the first threshold.

8. The method of claim 7,
resetting the prior open-loop control signal to a default value if the comparison of the characteristic monitored with the reference is less than zero.

9. The method of claim 1, providing the open-loop control signal to the amplifier includes providing to the amplifier a control signal that is not modified by feedback during an operating interval of the amplifier.

10. The method of claim 1,
monitoring the characteristic of the amplifier during the operating interval of the amplifier when the amplifier operates on a signal having a particular frequency;
the open-loop control signal is obtained by updating a prior open-loop control signal based on the characteristic monitored;
storing the updated open-loop control signal in a lock-up table in association with the particular frequency,
applying the stored open-loop control signal to the amplifier when the amplifier operates on a signal having the particular frequency at a future time.

11. A method of operating an amplifier, the method comprising:
activating the amplifier by providing an open-loop control signal to the amplifier;
monitoring a characteristic of the amplifier when the amplifier is active;
generating an updated open-loop control signal based on the characteristic monitored.

12. The method of claim 11, subsequently activating the amplifier by providing the updated open-loop control signal to the amplifier.

13. The method of claim 11, storing the updated control signal in a look-up table.

14. The method of claim 11,
monitoring the characteristic of the amplifier during multiple active intervals of the amplifier;
generating an updated open-loop control signal based on an average of the characteristic monitored during the multiple active intervals of the amplifier.

15. The method of claim 11,
monitoring the characteristic of the amplifier operating at different frequencies during corresponding active intervals of the amplifier;
generating updated open-loop control signals based on the characteristic monitored at the different frequencies, each of the updated open-loop control signals corresponding to a particular one of the different frequencies;
storing each of the updated open-loop control signals in a look-up table in association with its corresponding frequency.

16. The method of claim 11, monitoring the characteristic of the amplifier includes detecting at least one of an output power of the amplifier, a supply current of the amplifier, and a supply voltage of the amplifier.

17. The method of claim 11,
generating the updated open-loop control signal based on the characteristic monitored includes correcting a prior open-loop control signal based on the characteristic monitored relative to a reference frame.

18. The method of claim 11,
comparing the characteristic monitored with a reference,
generating the updated open-loop control signal includes correcting a prior open-loop control signal based on the comparison of the characteristic monitored with the reference.

19. The method of claim 18,
correcting the prior open-loop control signal if the comparison of the characteristic monitored with the reference exceeds a first threshold,
not correcting the prior open-loop control signal if the comparison of the characteristic monitored with the reference does not exceed the first threshold.

20. The method of claim 19,
resetting the prior open-loop control signal to a default value if the comparison of the characteristic monitored with the reference is less than zero.

21. A method in an amplifier, the method comprising:
operating the amplifier during active intervals by providing open-loop control signals to the amplifier;
monitoring a change in load impedance at an output of the amplifier;
providing an open-loop control signal to the amplifier based on the change in load impedance monitored during at least one previous active interval of the amplifier.

22. The method of claim 21,
monitoring the change in load impedance by detecting a characteristic of one of a supply current or supply voltage provided to the amplifier,
providing the open-loop control signal to the amplifier based on the characteristic of the supply current or supply voltage monitored.

23. The method of claim 21,
obtaining the updated open-loop control signal by correcting a prior open-loop control signal based on a change in load impedance monitored during a previous operating interval of the amplifier.

24. The method of claim 23,
comparing a characteristic of the amplifier related to the change in load impedance monitored with a reference,
correcting the prior open-loop control signal if the comparison of the characteristic of the amplifier with the reference exceeds a first threshold,
not correcting the prior open-loop control signal if the comparison of the characteristic monitored with the reference does not exceed the first threshold.

25. The method of claim 24,
resetting the prior open-loop control signal to a default value if the comparison of the characteristic monitored with the reference is less than zero.

26. The method of claim 21,
storing the updated open-loop control signal,
providing the open-loop control signal to the amplifier based on the change in load impedance monitored during at least one previous active interval of the amplifier by providing the stored updated open-loop control signal to the amplifier.

* * * * *